United States Patent [19]

Vermilyea

[11] Patent Number: 4,771,244

[45] Date of Patent: Sep. 13, 1988

[54] METHOD OF PASSIVELY SHIMMING MAGNETIC RESONANCE MAGNETS

[75] Inventor: Mark E. Vermilyea, Schenectady, N.Y.

[73] Assignee: General Electric Company, Schenectady, N.Y.

[21] Appl. No.: 937,299

[22] Filed: Dec. 3, 1986

[51] Int. Cl.$^4$ ............................................. G01R 33/20
[52] U.S. Cl. ................................................... 324/320
[58] Field of Search ............... 324/318, 319, 320, 300; 335/216, 299

[56] References Cited

U.S. PATENT DOCUMENTS 4,425,547  1/1984  Sugimoto .......................... 324/318
4,631,481 12/1986  Young et al. ....................... 324/320

OTHER PUBLICATIONS

"Aspects of Shimming a Superconductive Whole-Body MRI-Magnet", G. Frese, G. Pausch, G. Ries, Siemens AG, D-8520 Eriangen, Federal Republic of Germany, Proc. of 9th Intl. Conf. on Magnet Tech., 1985, pp. 249–251.

"Magnetic Field Homogeneity Correction Algorithm Using Pseudoinversion Formula for NMR Imaging", CB Ahn et al., Rev. Sci, Instrum, vol. 57, No. 4, Apr. 1986, pp. 683–688.

"Passive Shimming for Solenoidal Magnets", JH Coupland, Science and Engineering Research Council, Aug. 1986.

Primary Examiner—Michael J. Tokar
Assistant Examiner—Kevin D. O'Shea
Attorney, Agent, or Firm—William H. Steinberg; James C. Davis, Jr.; Paul R. Webb, II

[57] ABSTRACT

A method of predicting the locations and strengths of passive shims in the bore of a magnetic resonance magnet, necessary to attain imaging quality homogeneity in the bore of the magnet is provided. Electromagnetic coils are not needed to provide any shimming. The magnetic field effect of an arc of magnetized steel as a function of its position in the magnetized bore is determined. The locations at which an arc provides the most beneficial shimming effect are next determined. The most promising locations are used as a starting point for an iterative routine which attempts to identify a group of shim locations which will provide a prediction of inhomogeneity within the specified limit. The shims are placed in the magnet bore, the field measured and the result compared to prediction. If improvement is predicted by another iteration with the shim locations fixed, the determined thickness changes are implemented.

4 Claims, 6 Drawing Sheets

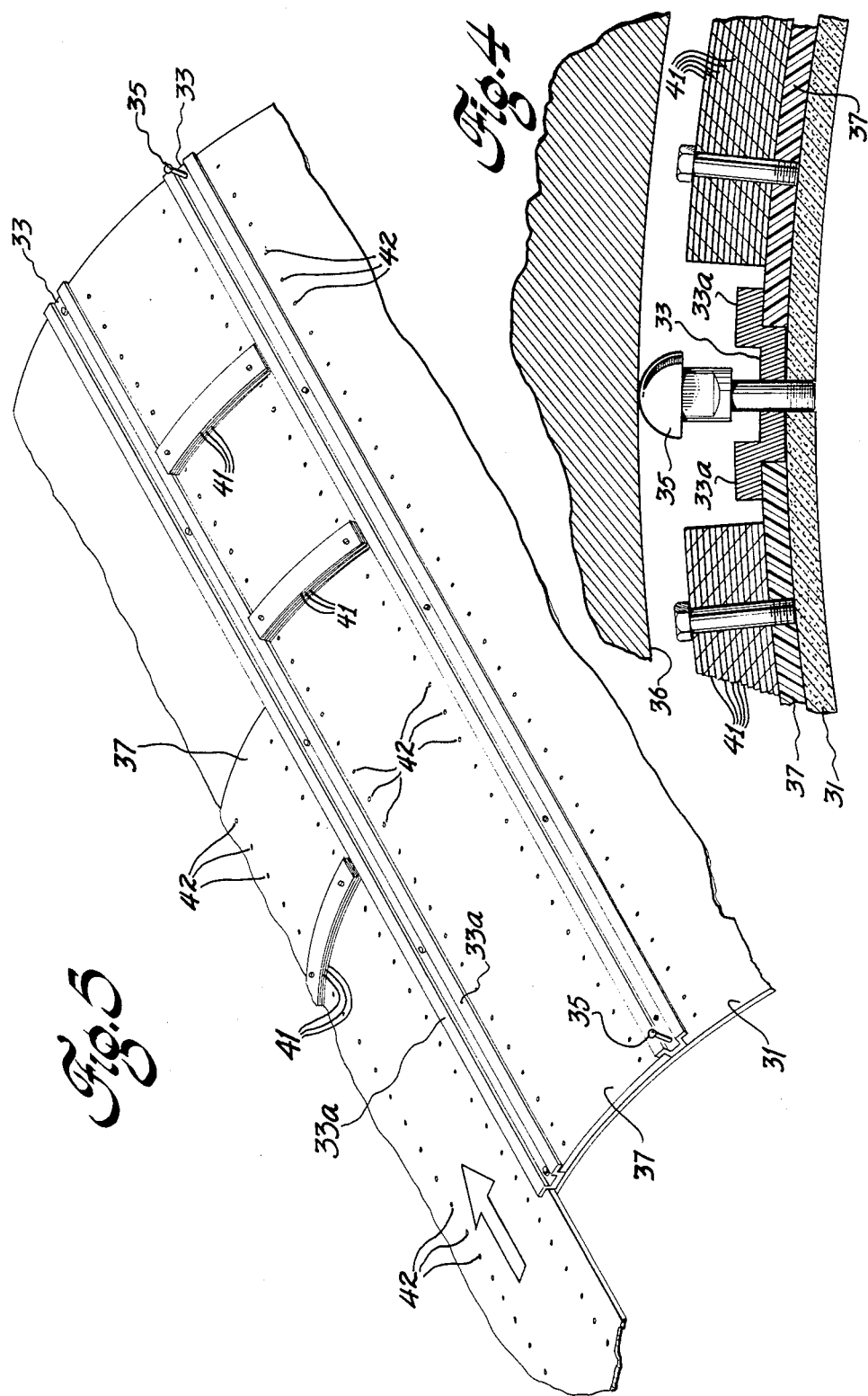

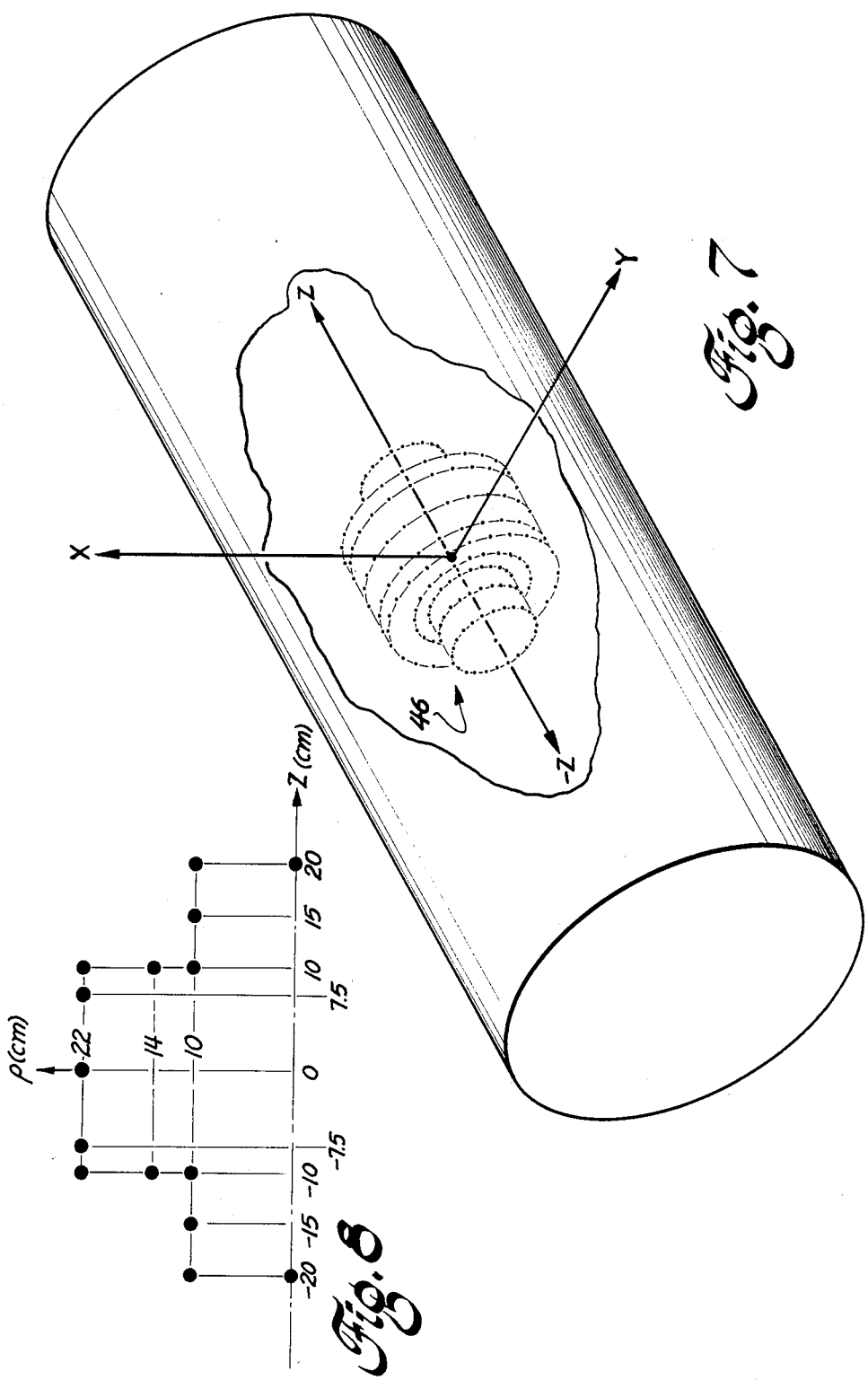

METHOD OF PASSIVELY SHIMMING MAGNETIC RESONANCE MAGNETS

CROSS REFERENCE TO RELATED APPLICATIONS

The present application is related to copending application Ser. No. 937,297, now U.S. Pat. No. 4,698,611 assigned to the same assignee as the present invention.

BACKGROUND OF THE INVENTION

The present invention relates to passively shimming magnetic resonance magnets to obtain imaging quality homogeneity in the bore of the magnet.

To create a highly uniform magnetic field with an electromagnet or array of permanent magnets, it is necessary to build the magnet to a carefully specified shape, and to strive to minimize the deviations from the specified shape due to manufacturing variations. The resulting magnets, however, typically require field corrections to achieve the desired level of inhomogeneity, due to deviations of the magnet from the design or due to the presence of ferromagnetic material in the vicinity of the magnet.

To improve field uniformity, correction coils are typically used. These coils are capable of creating different field shapes which can be superimposed on an inhomogeneous main magnetic field to perturb the main magnetic field in a manner which increases the overall field uniformity. Unfortunately, many sets of such coils are typically required. A state of the art magnetic resonance (MR) imaging magnet has between ten and twenty independent sets of correction coils, each with its own power supply to provide the correct current flow. Naturally, these coils add significantly to the cost and complexity of the magnet.

One way of removing the need for correction coils is to shim the magnet passively, using only pieces of iron to bring an initially inhomogeneous field to within imaging homogeneity specifications. With the iron placed inside the bore of the magnet a minimal addition to the size and weight would be required. A passively shimmed magnet would be cheaper and more reliable than the typical set of correction coils presently used.

The primary difficulty in implementing such a shimming approach lies in predicting the locations and sizes of iron pieces required to shim the field. Electromagnetic coils are generally designed to produce certain terms of a spherical harmonic expansion. Such a design criteria is difficult to implement with passive shims because the permeability of iron cannot be reversed, whereas a current reversal through a coil can be used to obtain a field reversal in a correction coil. Additionally, the size and complexity of the groups of shim pieces which would be required to produce a single harmonic would not make this approach feasible. Since magnetic coupling between the shims is also a complicating factor, shimming with large pieces which inevitably become physically close to one another increases the difficulty in properly shimming the magnet.

Passive shimming is currently used to correct large deviations in magnetic fields that cannot be corrected by the available correction coils alone. The passive shimming is accomplished by placing a piece of iron in an appropriate place outside the magnet. The desired level of field uniformity can then be achieved by the correction coils.

It is an object of the present invention to provide a method of passively shimming a magnetic resonance magnet to achieve a level of field inhomogeneity required for magnetic resonance imaging, without the use of correction coils.

It is a further object of the present invention to provide a method of determining the optimum axial and circumferential locations of shims to bring the field homogeneity to a level consistent with magnetic resonance imaging, using only pieces of ferromagnetic material.

It is a still further object of the present invention to provide a method of minimizing the total field inhomogeneity and not selected harmonics.

SUMMARY OF THE INVENTION

In one aspect of the present invention a method of passively shimming a magnet having a central bore and using shims placed in the bore of the magnet is provided. The method comprises the steps of measuring the initial field homogeneity in the bore of the magnet. Permissable shim locations are chosen in the bore of the magnet where shims can be conveniently placed. The magnetic field effect of a shim at each of the predetermined permissible shim locations in the bore of the magnet is checked independently of one another, to determine the shim strength needed to improve magnetic field inhomogeneity in the magnet bore. The locations wherein positive shim strengths were found to be beneficial are selected and used to determine shim strength at each selected location, considering all selected locations simultaneously. Locations found to require negative shim strengths are eliminated and with the new selected locations shim strengths are again determined until all selected locations remaining require positive shim strengths. The shims of predicted positive strengths are placed in their selected locations in the bore of the magnet.

BRIEF DESCRIPTION OF THE DRAWING

While the specification concludes with claims particularly pointing out and distinctly claiming the present invention, objects and advantages of the invention can be more readily ascertained from the following description of preferred embodiments when used in conjunction with the accompanying drawing in which:

FIG. 4 is a partial sectional end view of the shimming assembly of FIG. 3 situated in the bore of a magnetic resonance magnet;

FIG. 5 is a partial isometric view of the passive shimming assembly of FIG. 3 showing one of the removable drawer sections being slid into place in the passive shim assembly;

FIG. 7 is a cutaway isometric view of the bore of a magnetic resonance magnet showing the locations in which the magnet inhomogeneity is checked; and FIG. 8 is a partial side view with dimensions of FIG. 7, showing the locations in which the magnet inhomogeneity is checked.

DETAILED DESCRIPTION OF THE DRAWING

Figure 1:
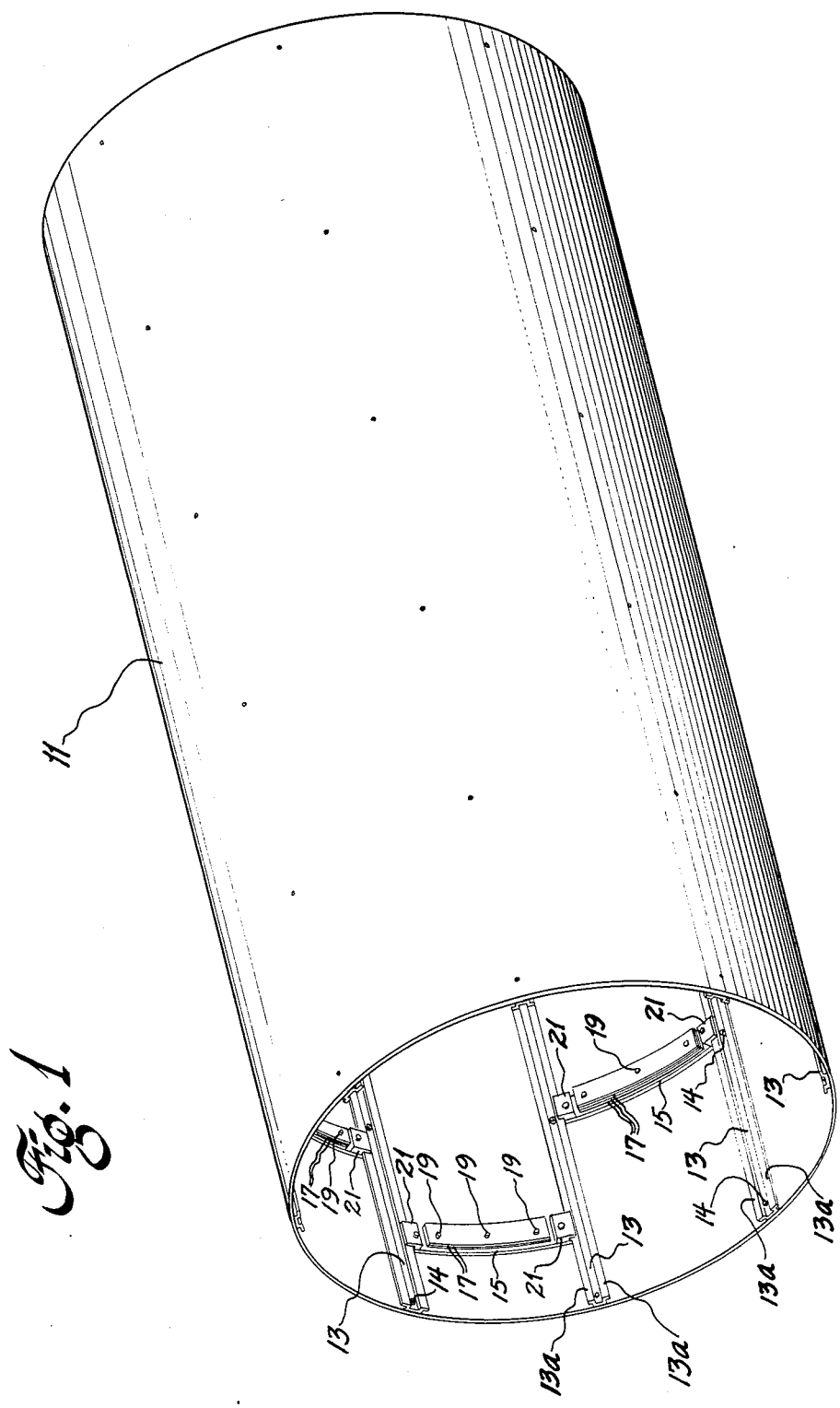
FIG. 1 is an isometric view of a passive shimming assembly.

Referring now to the drawing and particularly FIG. 1 thereof, a passive shim assembly comprising a nonmagnetic thin wall tube 11 is shown. The tube is fabricated of fiberglass creating a tube with a ⅛" wall thickness. A plurality of longitudinally extending nonmagnetic channel pieces 13 are equally circumferentially spaced about the interior of the tube 11. The channel pieces extend the length of the tube and are secured thereto by screws threadingly engaging the fiberglass tube. The channel pieces each have two projecting edges 13a extending on either side of the channel. The edges are parallel to the tube and spaced away therefrom. The edges extend the longitudinal length of the tube. The channel pieces can be fabricated by extruding aluminum to the desired shape or if eddy currents are a problem, the channel pieces can be pultruded from composite material. Pultrusion is a process in which continuous filaments are drawn through an orifice, which also meters out encapsulating resin such as a thermoplastic.

Arcuate carrier pieces 15 of nonmagnetic material, such as fiberglass, are slidably mounted between the two adjacent channels with the projecting edges 13a of two adjacent channels preventing radial movement of the carrier pieces 15. Ferromagnetic strips 17, which provide the shimming, are stacked to the desired height on the carrier pieces with the strips having a length less than the length of the arcuate carrier pieces. The ferromagnetic strips can comprise 0.010 inch thick low carbon steel, cut to an axial width of 2 cm. and a circumferential extent at their mean radius of 30 degrees for a 1 meter bore magnet. The strips are secured tp the arcuate carrier pieces such as by threaded fasteners 19.

Figure 2:
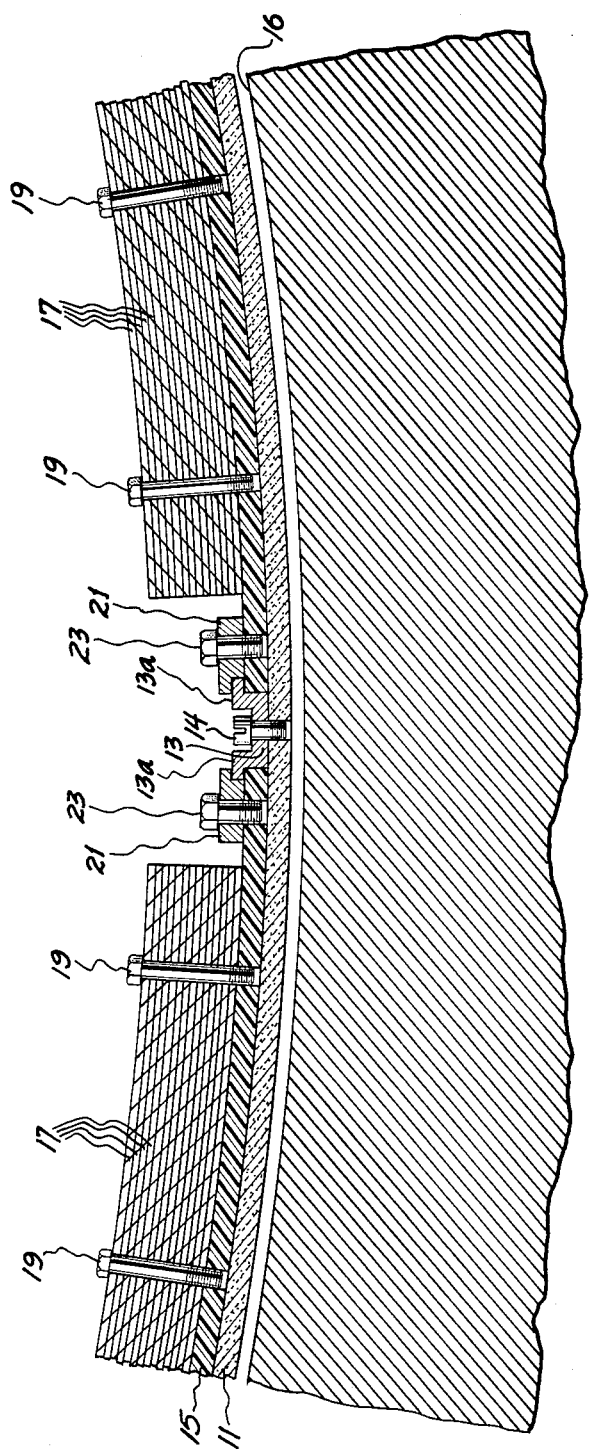
FIG. 2 is a partial sectional end view of the shimming assembly of FIG. 1 situated in the bore of a magnetic resonance magnet.

The carrier pieces are anchored in their longitudinal position by clamps 21 which can be fabricated from aluminum. The clamps, which can be more easily seen in FIG. 2, when tightened by bolts 23 to the arcuate carrier piece, captures a portion of the edge 13a of channel 13 between the clamps and the arcuate carrier piece fixing the longitudinal position of the ferromagnetic strips.

The radial thickness of the entire assembly is kept to a minimum to minimize interference with precious bore space, which is occupied by gradient and RF coils and the patient table (which are not shown).

The axial position of the ferromagnetic strips is infinitely adjustable and very fine adjustment of the shim strength is available by changing the stack height of the strips. Thinner steel strips may be used to provide finer strength adjustment. The channels are placed every 45 degrees around the inner circumference of the bore allowing eight discrete circumferential locations for the ferromagnetic strips. The choice of circumferential locations in the present embodiment was selected to shim for spherical harmonics having degree m=2. Fields with m=2 vary sinusoidally with $2\phi$, where $\phi$ is the circumferential angle. Therefore such fields have peaks or nodes every 45° circumferentially. Providing capability of placing shims every 45° will clearly allow shimming of the m=2 harmonics.

The maximum axial force on a 1 cm. thick shim with the magnet energized is about 20 pounds in a 0.5 T magnet. The shim carrier could be moved when the clamps are loosened while making adjustment of the axial locations. A handle could readily be made which would allow easy control of the shim carrier with the clamps loose.

Figure 3:
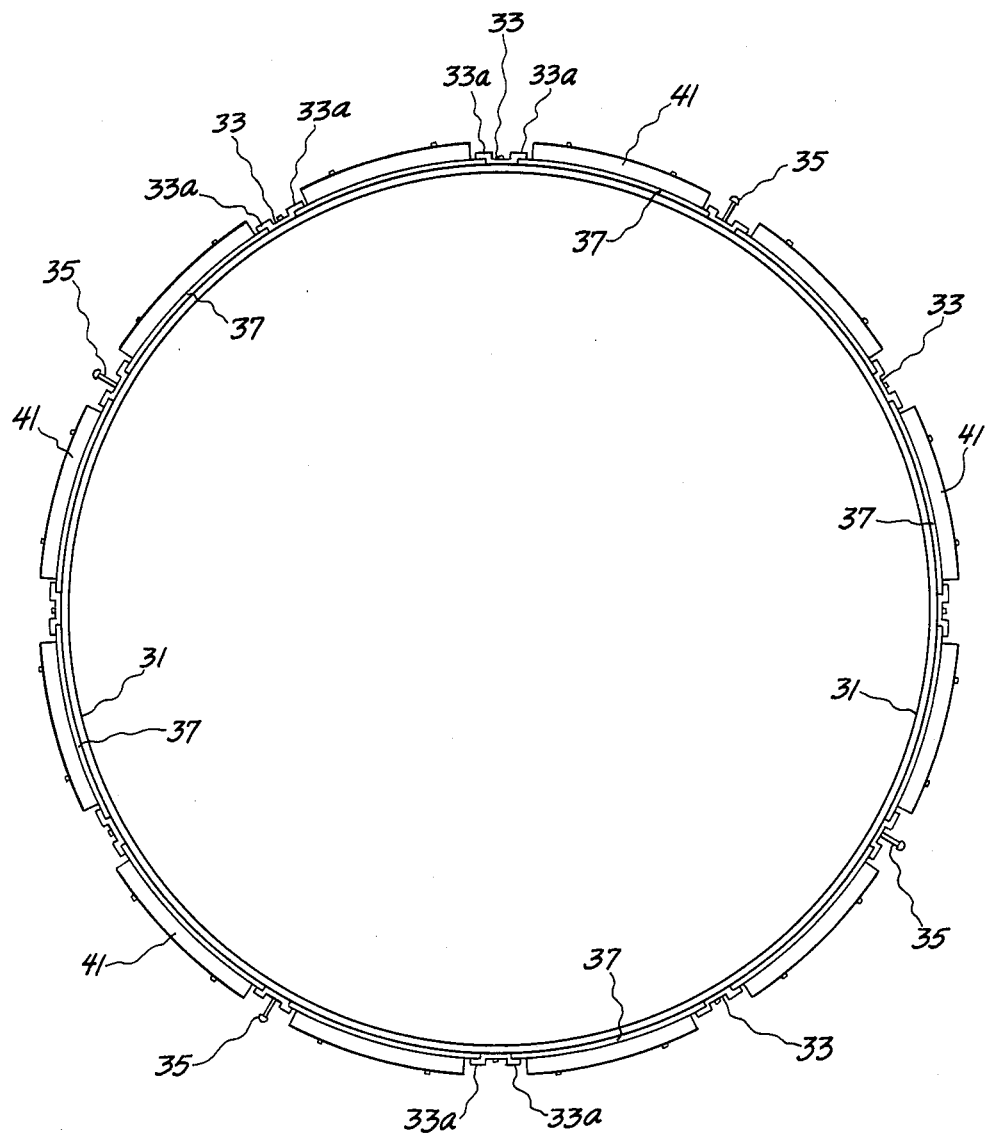
FIG. 3 is an end view of another passive shimming assembly.

Referring now to FIG. 3 another embodiment is shown. A passive shim assembly comprises a nonferromagnetic thin wall tube 31, which in the preferred embodiment is fabricated of fiberglass material ⅛" thick. A plurality of channel pieces 33 are equally spaced about the exterior of the tube. The channel pieces extend the length of the tube and are secured thereto by screws threadingly engaging the fiberglass tube 31. Some of the screws 35 located at the ends of the channel extend above the channel pieces surface to position the tube concentrically in the bore of the magnet. This can be more clearly seen in FIG. 4. The channel pieces have projecting edges 33a on either side of the channel, extending away from the channel. The edges are parallel to the tube and spaced away therefrom. The edges extend the longitudinal length of the tube. The channel pieces can be fabricated by extruding aluminum to the desired shape or if eddy currents are a problem, the channel can be pultruded from composite material. Increasing the number of circumferential locations provides greater flexibility in eliminating tesseral (axiperiodic) harmonics.

Arcuate shaped drawer pieces 37, as shown in FIG. 5, fit between adjacent edges 33a and extend the length of the tube. Ferromagnetic strips 41, which serve as the shims, are stacked to the desired height on the drawers and secured to the drawers using selected predrilled holes 42. With more axial holes provided, finer axial field adjustability can be obtained. The sliding axial adjustability of the shims in the FIG. 1 embodiment provides infinite adjustment, which might be desirable in some situations. The number of ferromagnetic strips provides an adjustment of strength. The radial thickness of the shims is kept to a minimum so that the shims fit in the space provided by the adjustable height of the extended screws 35. The drawers can slide out of the bore of the magnet to permit adjusting the axial position and thickness of the ferromatic strips. The drawers can be removed with the magnet energized and the ferromagnetic strip positions adjusted.

The position and height of the ferromagnetic strips in the bore of the magnet are used to create magnetic fields shapes which correct for inhomogeneities in the field created by the magnet. Flexibility of positioning the steel strips is therefore important so that all the field shapes needed to counteract fields which could preclude imaging quality homogeneity can be obtained. Flexibility in positioning is also important since it is doubtful that the initial prediction of the locations of the ferromagnetic strips will be perfect. Arcuate shims in specific locations are not intended to eliminate specific harmonics. Rather the combination of all the shims together are intended to increase the field homogeneity. In situations where required shim height would interfere with available bore space wider shims can be used in both embodiments.

Figure 6:
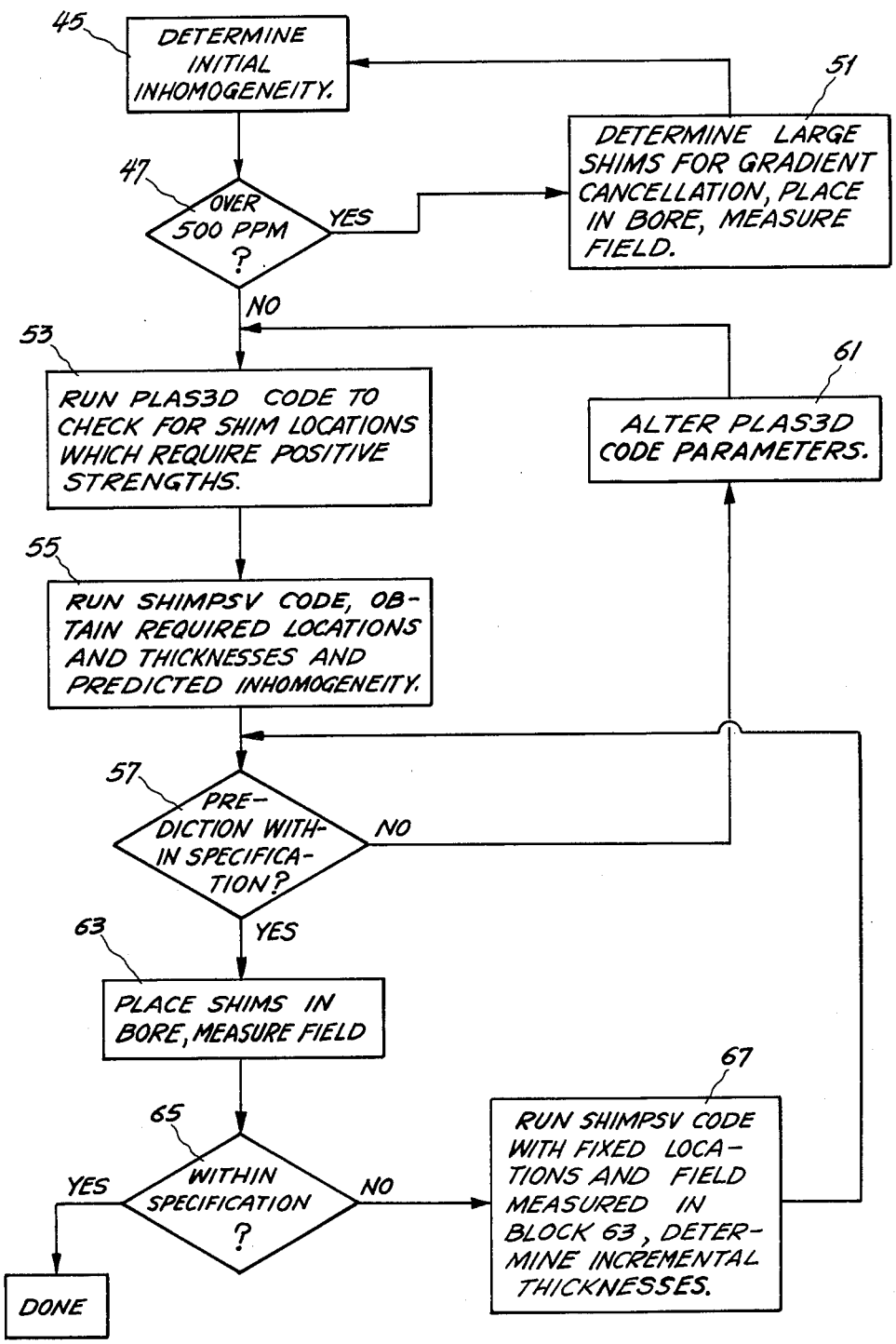
FIG. 6 is a flow chart for passively shimming a magnetic resonance magnet in accordance with the present invention.

Referring now to FIG. 6, a flow chart showing the steps in determining the correct positions and thicknesses of the shims is shown. The first step in block 45 is to determine the initial inhomogeneity in the bore of the magnet to be shimmed. The magnetic field is measured in the energized magnet on an imaginary grid 46. For a 0.5 Tesla superconducting magnet with a 1 meter diameter bore, a grid having 314 points which lie on the periphery of thirteen circles and on 2 points 20 cm on either side of the center of the bore on the z-axis, as shown in FIGS. 7 and 8, can be used. Five of the circles have their center point on the z axis and a diameter of 44 cm, six of the circles have their center point on the z axis and a diameter of 20 cm. The two remaining circles of the thirteen circles have a diameter of 28 cm. The larger circles are situated on either side of the center of the bore along the z axis at 7.5 and 10 cm. The smaller diameter circles are located on either side of the center point of the bore along the z axis at 10, 15 and 20 cm. The intermediate circles are concentric with the smaller and larger circles at 10 cm on either side of the center of the bore along the z axis. The measurements are taken at 24 equally spaced circumferential points along each of the circles. These circles follow the boundary of the volume of interest, as the maximum and minimum field values must lie there. The circle locations are chosen to be close to the ideal magnet field extremities, and the actual inhomogeneity should be close to that found by sampling their points. Based on a comparison of the measured field at each of the points, if the difference among the points is over 500 ppm, as determined in block 47, then the position of large shims for gradient cancellation is determined in block 51 and the field remeasured with the large shims in place. If the inhomogeneity is less then 500 ppm than PLAS3D code in block 53 is run.

The PLAS3D code determines for each permissible shim location the field effect of an arc shaped steel shim of given axial, radial and circumferential dimensions at each of the 314 field measurement points. The axial and circumferential positions of the arc shaped steel shims is a variable in the shimming procedure. For example, if the allowable domain of arcs is from $-90$ to 90 cm along the z-axis, the field effects can be determined with an arc every 10 cm along the z-axis. With higher densities the algorithm will take longer, but result in more possible shim locations and so provide generally better homogeneity.

The magnetic field of magnetized material may be represented as a series of spherical harmonics expanded about the origin of the magnet coordinate system. The equations for the magnetic field harmonics are:

$$B_z(r, \theta, \phi) = Bz_o + \sum_{n=1}^{\infty} \left\{ \sum_{m=0}^{n} Bz_{nm} + \sum_{m=-1}^{-n} Bz_{nm} \right\} \quad (1)$$

$$Bz^c_{nm} = A^c_{nm} H^c_{nm} \quad (2)$$

$$Bz^s_{nm} = A^s_{nm} H^s_{nm} \quad (3)$$

$$A^c_{nm} = a^c_{nm} M_z dV_o \quad (4)$$

$$A^s_{nm} = a^s_{nm} M_z dV_o \quad (5)$$

$$H^c_{nm} = r^n P_n{}^m(\cos \theta) \cos(m\phi) \quad (6)$$

$$H^s_{nm} = r^n P_n{}^m(\cos \theta) \sin(m\phi) \quad (7)$$

where the coefficients A(n,m) represent the volume integral over the shim, a(n,m) the transducer functions defined by Schenck et al., and P(n,m) the associated Legendre polynomial. The number of terms required to accurately represent the magnetic field depends on the size of the volume of interest, for the present shimming purposes, expansion through order and degree eight is sufficient. The magnetization in the steel shims may be calculated or assumed.

The determination of the arc field effects need only be done for one circumferential location at each chosen axial location, and the arc field indexed in fifteen degree increments to represent the field of any of twenty four circumferential locations. Typical circumferential arc densities are only 8 to 12 per circle, so that indexing gives accurate results.

Once the required data files have been created containing the field effect at each of the 314 field measurement points for all the predetermined arc shaped shim locations, the effect of each arc location individually on the chosen grid is evaluated for its optimum strength, defined as that strength which yields the minimum inhomogeneity on the imaging volume. Such optimization may be performed using a least squares routine which solves the following equations:

$$B_z(r, \theta, \phi) = Bz_m(r, \theta, \phi) + \sum_{i=1}^{Nsh} C_{mi}(r, \theta, \phi) t_i \quad (8)$$

$$\epsilon = \sum_{m=1}^{Npts} \left\{ (B_z - B_{zm}) - \sum_{i=1}^{Nsh} C_{mi} t_i \right\}^2 \quad (9)$$

$$\frac{\partial \epsilon}{\partial t_j} = -2 \sum_{m=1}^{Npts} \left\{ (B_z - B_{zm}) - \sum_{i=1}^{Nsh} C_{mi} t_i \right\} C_{mj} = 0$$

where $\epsilon$ is the chosen measure of field inhomogeneity, $Bz_m$ represents the measured field at point m, and $C_m$ is the coefficient representing the field per unit thickness created by a shim at the location in question at field point m. The equation is written for each arc location on the grid, and solved to give the shim thicknesses at each location which yields the minimum field inhomogeneity. This optimization on the thickness assumes that the field effect of an arc is linearly dependent on its thickness; i.e. that the magnetization of the arc doesn't change with thickness. This assumption is only strictly true for arcs which are saturated. If the shim thickness is negative, (not a physically realistic solution) the location is removed from consideration. The set of locations remaining is then fed into the SHIMPSV code in block 55 as an initial guess.

The SHIMPSV algorithm determines where the arcuate shims are to be positioned and their thicknesses. While the PLAS3D program may come up with many dozens of locations which require positive strength of shims, only 20-25 of these locations will be required for shimming. Therefore the algorithm must decide which ones to eliminate. The SHIMPSV algorithm starts with all the locations needing positive strength shims which is approximately half the locations initially checked by the PLAS3D algorithm. A linear least squares optimization is then performed on all the positive shim strengths simultaneously. The result of the initial run will contain negative strength shims, these locations are eliminated from consideration. Negative strengths result because the effect of all the shim locations found to have positive strengths individually is not the same as the effect of all these shim considered simultaneously. The remaining locations requiring positive strength shims are then taken, and the least square optimization run again. The process of eliminating negative strength locations is repeated until a solution with all positive strength is obtained. The predicted inhomogeneity of the solution is compared to the desired inhomogeneity in block 57. The field homogeneity attainable with a given group of positive strength shim locations generally depends inversely on the number of shim locations being worked with, so the more shims the better. If a solution with all positive strengths with a predicted inhomogeneity within specification is not possible, the parameters are altered in block 61 to increase the number of allowable shim locations tried by the PLAS3D code. It is desirable to use shims that are longitudinally closer to the center of the bore, since a smaller shim closer to the center will have a larger effect on the inhomogeneity in the center of the magnet than a shim positioned longitudinally displaced from the center. If a solution cannot be reached with a group of locations closer to the center the number of permissible shim locations can be increased and PLAS3D code run again. A solution with all positive shim strengths is a physical possibility, and is used for the initial placement of shims in the bore in block 63. Negative shim strengths would require a material with a negative permeability. With the shims in place in the energized magnet the field in the bore is again measured in the 314 locations on the grid in block 65. If the inhomogeneity deviates from the prediction more than desired, the SHIMPSV algorithm is run again with arc locations fixed and with the field values obtained with the shims in place. A least squares routine is then used to adjust the thicknesses of the arcs in block 67. These thickness changes should be small fractions of the initial thicknesses, and once implemented should reduce the inhomogeneity to within the desired range.

There are several possible changes in implementing the SHIMPSV algorithm in block 55 which may prove beneficial in certain cases. The locations which are removed from consideration at any step in the iteration of the SHIMPSV code because of negative shim thicknesses may be introduced in a latter iteration thus effectively providing more locations to try. If this results in a solution with more shims, the predicted inhomogeneity will be generally lower, making it desirable. The least squares determinations assume a linear relation between changes in shim thickness and the effect on the field. The above method of determining shim locations in the bore of a magnet can be used with electromagnetic magnets including superconducting magnets and permanent magnets.

The foregoing has described a method of passively shimming MR magnets assembly which can achieve a level of field homogeneity required for magnetic resonance imaging, without the use of correction coils.

While the invention has been described with respect to preferred embodiments, it will be apparent that certain modifications and changes can be made without departing from the spirit and scope of the invention. It is therefore, to be understood that the appended claims are intended to cover all such modifications and changes as fall within the true spirit of the invention.

What I claim is:

1. A method of paassively shimming a magnet having a central bore and using shims placed in the bore of the magnet, said method comprising the steps of:
   (a) measuring the initial field inhomogeneity in the bore of the magnet;
   (b) choosing permissible shim locations in the bore of the magnet;
   (c) checking the magnetic field effect of a shim at each of the permissible shim locations in the bore of the magnet independently of one another, to determine the shim strength needed to improve magnetic field inhomogeneity in the magnet bore;
   (d) selecting the locations where positive shim strengths were found beneficial;
   (e) determining shim strengths needed to improve magnetic field inhomogeneity at each selected location, considering all selected locations simultaneously;
   (f) eliminating locations found to require negative shim strength and repeating steps e and f until all selected locations remaining require positive shim strengths; and
   (g) placing shims of predicted thickness at the locations in the bore of the magnet selected in step f.

2. The method of claim 1 further comprising the following step after step f:
   predicting the field inhomogeneity resulting from the shims of predicted thickness being situated at their selected locations in the bore of the magnet;
   comparing the predicted inhomogeneity with a desired inhomogeneity;
   increasing the number of permissible shim locations chosen in step b to reduce the difference between the predicted and desired inhomogeneity and repeating steps c, d, e and f.

3. The method of claim 1 further comprising the following step:
   reintroducing in step f, a location previously eliminated in an earlier iteration as requiring a negative shim strength to help increase the number of selected locations found to require positive shim strengths.

4. The method of claim 1 further comprising the steps of:
   measuring the field inhomogeneity in the magnet bore with the shims in place:
   determining incremental changes in shim strength at the selected locations to reduce the difference between a desired inhomogeneity and a predicted inhomogeneity based on the field inhomogeneity measured with the shims in place; and
   incrementally changing the shim thicknesses at the selected locations in the magnet bore by the amounts determined in the previous step.

* * * * *

UNITED STATES PATENT AND TRADEMARK OFFICE
CERTIFICATE OF CORRECTION

PATENT NO. : 4,771,244
DATED : September 13, 1988
INVENTOR(S) : Mark Ernest Vermilyea It is certified that error appears in the above-identified patent and that said Letters Patent is hereby corrected as shown below:

In column 5, equation 4, after "=" insert -- $\phi$ --.

In column 5, equation 5, after "=" insert -- $\phi$ --.

Signed and Sealed this

Seventh Day of March, 1989

Attest:

DONALD J. QUIGG

Attesting Officer

Commissioner of Patents and Trademarks